(12) United States Patent
Yu

(10) Patent No.: US 10,446,624 B2
(45) Date of Patent: Oct. 15, 2019

(54) ORGANIC LIGHT EMITTING DISPLAY PANEL HAVING A REFLECTOR IN THE PIXEL DEFINITION LAYER

(71) Applicant: Wuhan China Star Optoelectronics Semiconductor Display Technology Co., Ltd., Wuhan, Hubei (CN)

(72) Inventor: Wei Yu, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/576,887

(22) PCT Filed: Aug. 3, 2017

(86) PCT No.: PCT/CN2017/095820
§ 371 (c)(1),
(2) Date: Nov. 27, 2017

(87) PCT Pub. No.: WO2019/014973
PCT Pub. Date: Jan. 24, 2019

(65) Prior Publication Data
US 2019/0067625 A1    Feb. 28, 2019

(30) Foreign Application Priority Data

Jul. 21, 2017   (CN) .......................... 2017 1 0600826

(51) Int. Cl.
*H01L 29/08*      (2006.01)
*H01L 51/30*      (2006.01)
(Continued)

(52) U.S. Cl.
CPC .......... *H01L 27/3246* (2013.01); *H01L 33/60* (2013.01); *H01L 51/5203* (2013.01);
(Continued)

(58) Field of Classification Search
CPC . H01L 33/60; H01L 51/5231; H01L 27/3246; H01L 51/5271; H01L 51/5209; H01L 51/5203; H01L 33/405
See application file for complete search history.

(56) References Cited

U.S. PATENT DOCUMENTS 10,186,561 B2 *   1/2019   Zhang ................. H01L 27/3246
2014/0077174 A1   3/2014   Park et al.
(Continued)

FOREIGN PATENT DOCUMENTS

CN   102893424 A   1/2013
CN   103915482 A   7/2014
(Continued)

*Primary Examiner* — Alonzo Chambliss
(74) *Attorney, Agent, or Firm* — Hemisphere Law, PLLC; Zhigang Ma

(57) ABSTRACT

An organic light emitting display panel is provided, includes a substrate, a transparent anode, a pixel definition layer, an organic light emitting layer and a plurality of cathodes having reflective function provided on the substrate. A plurality of open slots is provided on the pixel definition layer. The anodes are provided on one end of the open slot adjacent to the substrate, the organic light emitting layer is packed in the open slot, the cathodes are provided on another side of the open slot away from the substrate. A method of manufacturing an organic light emitting display panel is also provided. The reflective cathode is made only in light emitting region, can prevent sub-pixels from light interference emitted from adjacent sub-pixels as well as increase color purity and improve color shift phenomenon in a bottom emission type device.

17 Claims, 2 Drawing Sheets

(51) Int. Cl.
*H01L 27/32* (2006.01)
*H01L 51/52* (2006.01)
*H01L 33/60* (2010.01)

(52) U.S. Cl.
CPC ...... *H01L 51/5209* (2013.01); *H01L 51/5225* (2013.01); *H01L 51/5231* (2013.01); *H01L 51/5271* (2013.01)

(56) References Cited

U.S. PATENT DOCUMENTS

| | | | | |
|---|---|---|---|---|
| 2015/0364529 A1* | 12/2015 | Adachi | ............... | H01L 27/3246 257/40 |
| 2016/0013415 A1* | 1/2016 | Ren | ................... | H01L 51/5271 257/40 |
| 2018/0026086 A1* | 1/2018 | Adachi | ............... | H01L 27/3246 257/40 |

FOREIGN PATENT DOCUMENTS

| | | |
|---|---|---|
| CN | 104716164 A | 6/2015 |
| CN | 106024836 A | 10/2016 |
| CN | 106910762 A | 6/2017 |
| CN | 106941113 A | 7/2017 |

\* cited by examiner

ORGANIC LIGHT EMITTING DISPLAY PANEL HAVING A REFLECTOR IN THE PIXEL DEFINITION LAYER

RELATED APPLICATIONS

The present application is a National Phase of International Application Number PCT/CN2017/095820, filed Aug. 3, 2017, and claims the priority of China Application No. 201710600826.5, filed Jul. 21, 2017.

BACKGROUND OF THE INVENTION

1. Field of the Invention

The present disclosure relates to a field of an organic light emitting display technique. In particular, it includes the organic light emitting display panel and a method of making the same.

2. The Related Arts

Organic Light Emitting Diode (OLED) display is a new generation display, through making an organic thin film on the OLED substrate, and arranging the organic thin film between cathode metal and anode metal or the conductive layer, as well as applying the voltage to both electrodes, the organic thin film will light. OLED monitor has a plurality of advantages than a liquid crystal display such as self-luminous, fast response, wide viewing angle, saturated color and so on.

OLED device is divided into top emission type device and bottom emission type device. In the bottom emission type device, the anode generally adopts a transparent conductive layer such as indium tin oxide (ITO), and the cathode generally adopts a metal with high reflectivity such as aluminum, magnesium and silver. In addition, the light emitted from the organic material emits in all directions, some of which injects directly from the anode and some of which reflects through the cathode and injects from the anode, and ultimately received by the human eye.

However, since to the screen resolution is getting higher and higher currently, as well as more and more dense arrangement between pixels. In the emission type device, a part of the light emitted from the organic material of a sub-pixel emits from the adjacent sub-pixels through the reflection of the cathode in non-emitting region, resulting in the decrease of color purity and color shift phenomenon, thereby affecting the display effect.

SUMMARY

Owing to the deficiencies of the prior arts, the present disclosure provides an organic light emitting display panel and a method of making the same, which can prevent sub-pixels from light interference emitted from adjacent sub-pixels as well as increase color purity and improve color shift phenomenon of bottom emission type device.

To achieve the above objectives, the present disclosure adopts the following technical solutions:

An organic light emitting display panel comprises a substrate, an anode provided on the substrate, a pixel definition layer, an organic light emitting layer, and a cathode having reflective function, wherein a plurality of open slots are provided on the pixel definition layer, one end of the open slot adjacent to the substrate is disposed on the anode, the organic light emitting layer is packed in the open slot, the cathode is disposed on the organic light emitting layer and being contained in the open slot.

As one of the embodiments, the organic light emitting panel further comprises a conductive layer, the conductive layer is disposed above the pixel definition layer and the cathode, and full covers the pixel definition layer and the cathode.

As one of the embodiments, the conductive layer is mesh-shaped connected to all the anodes, or the conductive layer is flake-shaped full covering the pixel definition layer and the cathode.

As one of the embodiments, the panel comprises a thin film encapsulation layer, the thin film encapsulation layer covers an outer surface of the conductive layer.

As one of the embodiments, the panel further comprises a reflector, the reflector is provided in the pixel definition layer and being used to reflect an incident light toward adjacent organic light emitting layer.

As one of the embodiments, the reflector comprises a first reflective part having a concave curved reflective surface, the first reflective part is a rotating body.

As one of the embodiments, the reflector further comprises a second reflective part covering one end of the first reflective part, edges of the second reflective part are peripherally extended from the end of the first reflective part.

As one of the embodiments, the reflector comprises a cylindrical reflective ring disposed vertically to the substrate.

Another objective of the present disclosure is to provide a method of manufacturing the organic light emitting display panel, comprising: providing a substrate, making an anode, a pixel definition layer, an organic light emitting layer, and a cathode having reflective function on the substrate. Wherein the cathode covers only on the organic light emitting layer.

In the organic light emitting panel of the present disclosure, the cathode having reflective function is only made in light emitting region, and the cathode having the reflective function is not made in non-emitting region. That can prevent sub-pixels from light interference emitted from adjacent sub-pixels as well as increase color purity and improve color shift phenomenon of emission type device.

DETAILED DESCRIPTION OF THE PREFERRED EMBODIMENTS

To clarify the objectives, technical solutions and advantages, the present disclosure is further described in detail below with accompanying figures and embodiments. It should be understood that the specific embodiments described herein are merely employed for explaining and understanding the present invention, but are not limitations thereto.

The organic light emitting display panel of the present disclosure is a bottom emission type panel, which comprises a substrate and an anode provided on the substrate, a pixel definition layer, an organic light emitting layer, a cathode, and a plurality of open slots provided on the pixel definition layer. One end of the open slot adjacent to the substrate is provided on the anode, the organic light emitting layer is packed in the open slot, the cathode is provided on the organic light emitting layer and being contained in the open slot. The substrate, the anode, the pixel definition layer, and the organic light emitting layer are made of transparent material, the cathode and the anode correspond with each other and made by as adopting the material having reflective function such as aluminum, magnesium and silver with high reflectivity. When the anode and the cathode are energized, the organic light emitting layer emits light, the light is emitted from a side of the substrate after being reflected by the cathode. In the present disclosure, the open slots of the pixel definition layer are light emitting region of the OLED device, other regions are non-emitting region. Because of the cathode with reflective function is only made in the light emitting region and is not made in the non-emitting region, the light of the OLED device which is supposed to be emitted to the cathode in the non-emitting region will directly transmit and being absorbed by the adjacent structures instead of being reflected to the adjacent sub-pixels. Therefore, it can increase the color purity of the display panel and improve the color shift phenomenon. The present disclosure is further described below in combination with several specific embodiments.

Embodiments 1

Figure 1:
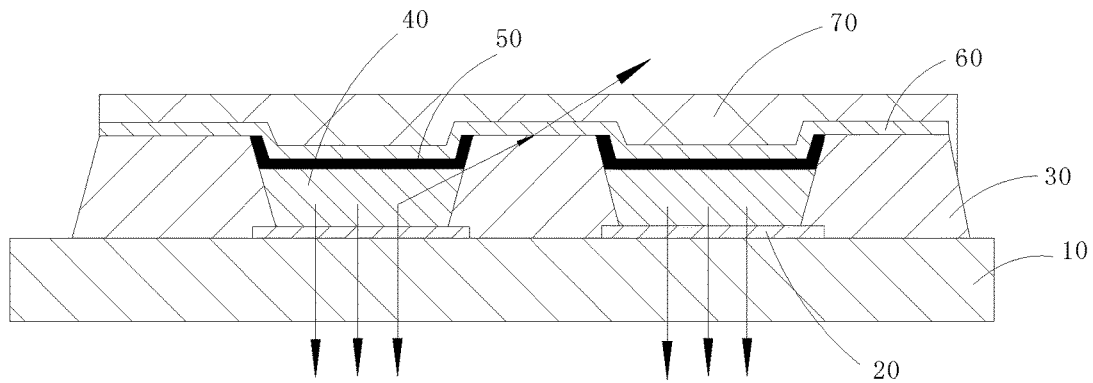
FIG. 1 is a schematic diagram of a stacked structure of an organic light emitting panel according to embodiment 1 of the present disclosure.

Referring to FIG. 1, the bottom emission type organic light emitting display panel of the present embodiment comprises a substrate 10, an anode 20 provided on the substrate 10, a pixel definition layer 30, an organic light emitting layer 40, and a cathode 50 having reflective function. Wherein a plurality of open slots are provided on the pixel definition layer 30, one end of the open slot adjacent to the substrate 10 is disposed on the anode 20, the organic light emitting layer 40 is packed in the open slot, the cathode 50 is disposed on the organic light emitting layer 40 and being contained in the open slot away from the substrate 10, two ends of the open slot are respectively corresponding to an anode 20 and a cathode 50.

In order to make all the cathodes 50 electrically connect with each other to facilitate the transmission of electrical signals, in the present embodiment, a conductive layer 60 is further disposed on the surface of the cathode 50. The conductive layer 60 is disposed above the pixel definition layer 30 and the cathodes 50, and full covers with the pixel definition layer 30 and the cathode 50, the conductive layer 60 can be flake-shaped that fully covering the pixel definition layer 30 and cathodes 50. In other embodiment, the conductive layer 60 can also be mesh-shaped, the conductive layer 60 is hollowed in a region corresponding to the pixel definition layer 30 and only contacts and electrically connects with all the cathodes 50 at the same time. The manufacturing process of the flake-shaped conductive layer 60 is simpler, the manufacturing cost is lower, and the conductive reliability is better.

In addition, in order to ensure the service life, waterproof and dustproof performance of the organic light emitting display panel, the surface of the panel may further comprises a thin film encapsulation layer 70 fully covers an outer surface of the conductive layer 60. The thin film encapsulation layer 70 can be a thin film encapsulation material, or a glass cover.

The present disclosure still provides a method of manufacturing a bottom emission type organic light emitting display panel, it mainly comprises providing a substrate 10, making a transparent anode 20, a pixel definition layer 30, an organic light emitting layer 40, and a cathode 50 having reflective function on the substrate 10. It should be noted that the cathode 50 covers only on the organic light emitting layer 40 (that is the pixel region).

Figure 2:
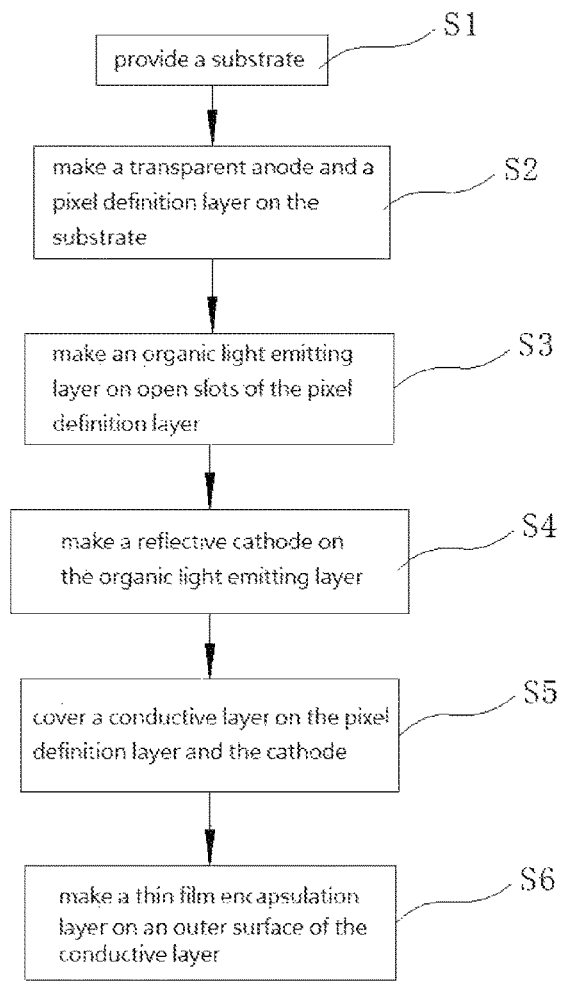
FIG. 2 is a flow chart of making an organic light emitting display panel according to embodiment 1 of the present disclosure.

Specifically, as shown in FIG. 2, the method of manufacturing the bottom emission type organic light emitting display panel of the present embodiment includes:

S1, providing the substrate 10;

S2, making the transparent anode 20 and the pixel definition layer 30;

S3, providing the organic light emitting layer 40 in the open slots of the pixel definition layer 30;

S4, making the cathode 50 having reflective function on the organic light emitting layer 40;

S5, covering the conductive layer 60 on the cathode 50 and the pixel definition layer 30;

S6, making the thin film encapsulation layer 70 on an outer surface of the conductive layer 60.

Because the cathode 50 covers only on the organic light emitting layer 40 (that is the pixel region) and does not extend to non-emitting region, the light of the OLED device which is supposed to be emitted to the cathode in the non-emitting region will directly transmit and being absorbed by the adjacent structures instead of being reflected to the adjacent sub-pixels. Therefore, it can increase the color purity of the display panel and improve the color shift phenomenon.

It should be understood that the method of manufacturing the bottom emission type organic light emitting display panel in the present embodiment further includes forming a thin film transistor on the substrate, that is making a semiconductor layer, a gate, a source and a drain. Also, making a gate line to connect the thin film transistor, a data line to connect the thin film transistor, and insulation layers used as insulation between the conductive layers. The method will not be described in detail herein.

Embodiments 2

Figure 3:
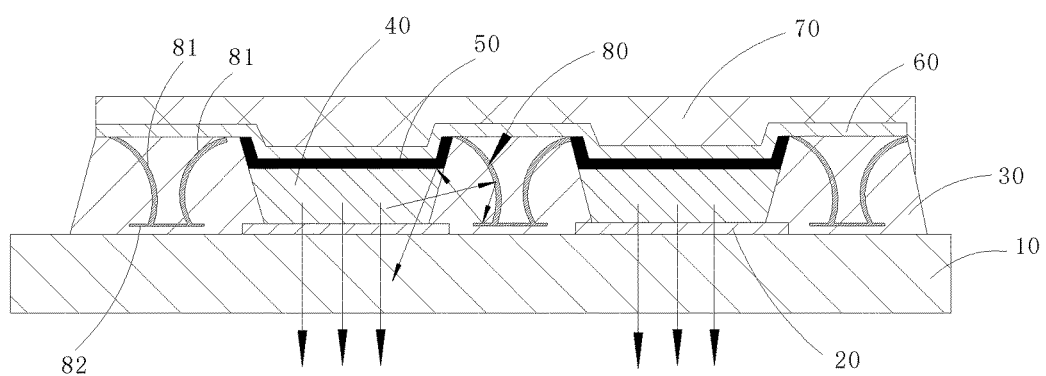
FIG. 3 is a schematic diagram of a stacked structure of an organic light emitting panel according to embodiment 2 of the present disclosure.

As shown in FIG. 3, apart from the embodiment 1, the bottom emission type organic light emitting display panel of the present embodiment further comprises a reflector 80, the reflector 80 is provided in the pixel definition layer 30, and being used to reflect an incident light toward the adjacent organic light emitting layer 40.

The reflector 80 comprises a first reflective part 81 having a concave curved reflective surface, the first reflective part 81 is a rotating body, as well as comprises a second reflective part 82 covering one end of the first reflective part, edges of the second reflective part 82 are peripherally extended from the end of the first reflective part 81. A part of the light emitted from the organic emitting layer 40 to the pixel definition layer 30 is reflected back to the organic emitting layer 40 by the second reflective part 82, there are few parts of the light being reflected back to the second reflective part 82 through the first reflective part 81. Therefore, realizing the secondary utilization of the light emitted to the pixel definition layer 30, and improving the utilization of the light.

Embodiments 3

Figure 4:
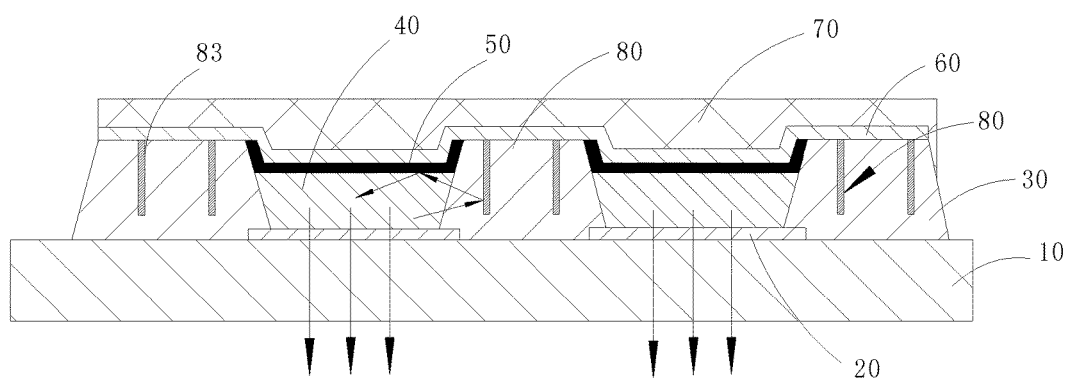
FIG. 4 is a schematic diagram of a stacked structure of an organic light emitting panel according to embodiment 3 of the present disclosure.

As shown in FIG. 4, apart from the embodiments 2, the reflector 80 of the present embodiment comprises a cylindrical reflective ring 83 disposed vertically to the substrate 10. The cylindrical reflective ring 83 can reflect the light emitted from adjacent organic emitting layers 40 to prevent the interference between adjacent pixels, and improve the light utilization.

In the bottom emission type organic light emitting display panel of the present disclosure, the cathode having reflective function is only made in light emitting region, and the cathode having the reflective function is not made in non-emitting region. That can prevent sub-pixels from light interference emitted from adjacent sub-pixels as well as increase color purity and improve color shift phenomenon of bottom emission type device.

Finally, it should be noted that the above embodiments are merely illustrative of the technical solutions of the present disclosure and are not intended to be limiting thereof. For the person skilled in the art of the disclosure, without departing from the concept of the disclosure, simple deductions or substitutions can be made and should be included in the protection scope of the disclosure.

What is claimed is:

1. An organic light emitting display panel comprising a substrate, an anode provided on the substrate, a pixel definition layer, an organic light emitting layer, and a cathode having reflective function, wherein a plurality of open slots are provided on the pixel definition layer, one end of the open slot adjacent to the substrate is disposed on the anode, the organic light emitting layer is packed in the open slot, the cathode is disposed on the organic light emitting layer and being contained in the open slot;

wherein the organic light emitting display panel further comprising a reflector provided in the pixel definition layer and being used to reflect an incident light toward adjacent organic light emitting layer.

2. The organic light emitting display panel according to claim 1, further comprising a conductive layer, wherein the conductive layer is disposed above the pixel definition layer and the cathode, and full covers the pixel definition layer and the cathode.

3. The organic light emitting display panel according to claim 2, wherein the conductive layer is mesh-shaped and connected to all the cathodes.

4. The organic light emitting display panel according to claim 2, wherein the conductive layer is flake-shaped and full covering the pixel definition layer and the anode.

5. The organic light emitting display panel according to claim 2, further comprising a thin film encapsulation layer, wherein the thin film encapsulation layer covers an outer surface of the conductive layer.

6. The organic light emitting display panel according to claim 2, further comprising a reflector, wherein the reflector is provided in the pixel definition layer and being used to reflect an incident light toward adjacent organic light emitting layer.

7. The organic light emitting display panel according to claim 6, wherein the reflector comprises a first reflective part having a concave curved reflective surface, the first reflective part is a rotating body.

8. The organic light emitting display panel according to claim 7, wherein the reflector further comprises a second reflective part covering one end of the first reflective part, edges of the second reflective part are peripherally extended from the end of the first reflective part.

9. The organic light emitting display panel according to claim 6, wherein the reflector comprises a cylindrical reflective ring disposed vertically to the substrate.

10. The organic light emitting display panel according to claim 1, wherein the reflector comprises a first reflective part having a concave curved reflective surface, the first reflective part is a rotating body.

11. The organic light emitting display panel according to claim 10, wherein the reflector further comprises a second reflective part covering one end of the first reflective part, edges of the second reflective part are peripherally extended from the end of the first reflective part.

12. The organic light emitting display panel according to claim 1, wherein the reflector comprises a cylindrical reflective ring disposed vertically to the substrate.

13. A method of manufacturing an organic light emitting display panel, wherein the panel comprises a substrate, an anode provided on the substrate, a pixel definition layer, an organic light emitting layer, and a cathode having reflective function, a plurality of open slots are provided on the pixel definition layer, one end of the open slot adjacent to the substrate is disposed on the anode, the organic light emitting layer is packed in the open slot, the cathode is disposed on the organic light emitting layer and being contained in the open slot, and a reflector is provided in the pixel definition layer and being used to reflect an incident light toward adjacent organic light emitting layer; the method comprising: providing the substrate, and making the transparent anode, the pixel definition layer, the organic light emitting layer, and the cathode having reflective function on the substrate, wherein the cathode covers only on the organic light emitting layer.

14. The method of manufacturing an organic light emitting display panel according to claim 13, further comprising a conductive layer, wherein the conductive layer is disposed above the pixel definition layer and the cathode, and full covers the pixel definition layer and the cathode.

15. The method of manufacturing an organic light emitting display panel according to claim 13, wherein the reflector comprises a first reflective part having a concave curved reflective surface, the first reflective part is a rotating body.

16. The method of manufacturing an organic light emitting display panel according to claim 15, wherein the reflector further comprises a second reflective part covering one end of the first reflective part, edges of the second reflective part are peripherally extended from the end of the first reflective part.

17. The method of manufacturing an organic light emitting display panel according to claim 13, wherein the reflector comprises a cylindrical reflective ring disposed vertically to the substrate.

* * * * *